(12) United States Patent
Chang et al.

(10) Patent No.: US 7,681,458 B2
(45) Date of Patent: Mar. 23, 2010

(54) APPARATUS, METHOD, AND MEDIUM FOR ADAPTIVELY SETTING REFERENCE SENSING BOUNDARY OF TOUCH SENSOR

(75) Inventors: Wook Chang, Yongin-si (KR);
Won-chul Bang, Yongin-si (KR);
Joon-ah Park, Yongin-si (KR);
Yeun-bae Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 133 days.

(21) Appl. No.: 11/645,705

(22) Filed: Dec. 27, 2006

(65) Prior Publication Data

US 2007/0186663 A1    Aug. 16, 2007

(30) Foreign Application Priority Data

Feb. 13, 2006    (KR) ............... 10-2006-0013687

(51) Int. Cl.
*G01B 7/16*    (2006.01)
(52) U.S. Cl. ....................................... 73/774
(58) Field of Classification Search ............ 73/774; 345/173
See application file for complete search history.

(56) References Cited

U.S. PATENT DOCUMENTS

| | | | | |
|---|---|---|---|---|
| 5,036,321 A * | 7/1991 | Leach et al. | ........... | 341/33 |
| 5,796,183 A * | 8/1998 | Hourmand | ........... | 307/116 |
| 6,661,410 B2 * | 12/2003 | Casebolt et al. | ........... | 345/173 |
| 6,885,365 B1 * | 4/2005 | Kang | ........... | 345/173 |
| 7,208,694 B2 * | 4/2007 | Urman et al. | ........... | 200/600 |
| 2007/0247172 A1 * | 10/2007 | Li | ........... | 324/687 |

FOREIGN PATENT DOCUMENTS

| | | |
|---|---|---|
| JP | 9-162715 | 6/1997 |
| JP | 2003-46383 | 2/2003 |
| KR | 2001-0111757 | 12/2001 |
| KR | 10-2005-0055156 | 6/2005 |

* cited by examiner

*Primary Examiner*—Lisa M Caputo
*Assistant Examiner*—Freddie Kirkland, III
(74) *Attorney, Agent, or Firm*—Staas & Halsey LLP (57) ABSTRACT

Provided are an apparatus for and method and medium of adaptively setting a reference sensing boundary of a touch sensor. The apparatus for adaptively setting a reference sensing boundary includes a reference sensing boundary setting unit adaptively setting a reference sensing boundary of a capacitance using a signal generated by a reference touch sensor; a determination unit determining whether or not a value measured by a device control touch sensor controlling a device to which the reference touch sensor is attached is within the set reference sensing boundary, by sensing a change in the capacitance; and an output unit outputting the measured value if the determination result indicates that the measured value is within the reference sensing boundary. Accordingly, the reference sensing boundary of the touch sensor is automatically recalculated without a user's intervention and a sensitivity and threshold of the touch sensor are adaptively changed so that the operational reliability of the touch sensor can be enhanced.

31 Claims, 5 Drawing Sheets
(1 of 5 Drawing Sheet(s) Filed in Color)

APPARATUS, METHOD, AND MEDIUM FOR ADAPTIVELY SETTING REFERENCE SENSING BOUNDARY OF TOUCH SENSOR

CROSS-REFERENCE TO RELATED APPLICATIONS

This application claims priority from Korean Patent Application No. 10-2006-0013687 filed on Feb. 13, 2006 in the Korean Intellectual Property Office, the disclosure of which is incorporated herein by reference in its entirety.

BACKGROUND OF THE INVENTION

1. Field of the Invention

The present invention relates to a sensing technology of a touch sensor, and more particularly, to an apparatus for and method and medium of adaptively setting a reference sensing boundary of a touch sensor in which a reference sensing boundary of a touch sensor is set adaptively so that a value measured by the touch sensor is output only when the value is within the set reference sensing boundary.

2. Description of the Related Art

In general, touch type switches are becoming more commonly used than pushbutton type switches in consumer electronic products or liquid crystal display (LCD) monitors. In touch switches, an electrode is disposed inside a front surface cover of a product, and if the electrode part is touched by a user's finger, a change in capacitance induced between the electrode and the person is sensed, and this sensing signal is transferred as a switch signal to a microprocessor or a microcomputer.

In this touch switch method, when a person approaches an electrode disposed in a predetermined position, in order to sense a change in capacitance induced between the electrode and a person in contact with the electrode, or a change in inductance or impedance, a signal comparator is used sometimes. In a conventional signal comparison method, a sensed value is typically compared with a reference value, which is a preset value. Accordingly, two inputs are always required: an input for setting a reference value and an input for sensing a value.

In addition to the capacitance, in order to compare all analogue signals, the conventional technology requires adjustment for setting reference values according to various conditions and environments of an apparatus attached to a circuit that performs comparisons using a voltage comparator, a current comparator and a frequency comparator. Accordingly, in the development and mass-production of switches, cost and time increase. Even after a reference value is set, the conditions under which the reference value was set change with respect to changes in the surrounding conditions or changes in the environment, which causes difficulties in the maintenance and modification of the reference value.

Korean Patent Laid-Open Application No. 2005-0055156 discloses a technology used to solve the problem mentioned above. In this technology a sensing method and apparatus for a digital sensor use a method of automatically setting a reference value. According to the technology, the difference between a stored reference signal and a sensed signal is obtained for comparison, and if the sensed signal is greater than the reference signal for a predetermined time, the reference signal is updated with the sensed signal. That is, changes in capacitance caused by a human body and environmental changes are determined with respect to time.

However, according to the above technology, when a user's hand is wet or a touch sensor is used in a humid environment, the reference value changes and cannot be lowered until the system is completely reset. Accordingly, changes in capacitance due to actual contact with a human body cannot be sensed and the touch sensor is not suitable to be used for a portable device.

SUMMARY OF THE INVENTION

Additional aspects, features, and/or advantages of the invention will be set forth in part in the description which follows and, in part, will be apparent from the description, or may be learned by practice of the invention.

The present invention provides an apparatus, method, and medium of adaptively setting a reference sensing boundary of a touch sensor in which a reference sensing boundary of the touch sensor is automatically recalculated without a user's intervention and a sensitivity and threshold of the touch sensor are adaptively changed so that the operational reliability of the touch sensor can be enhanced.

According to an aspect of the present invention, there is provided an apparatus for adaptively setting a reference sensing boundary including a reference sensing boundary setting unit adaptively setting a reference sensing boundary of a capacitance by using a signal generated by a reference touch sensor; a determination unit determining whether or not a value measured by a device control touch sensor, which is attached to a device and controls the device, is within the set reference sensing boundary, by sensing a change in the capacitance; and an output unit outputting the measured value if the determination result indicates that the measured value is within the reference sensing boundary.

According to an aspect of the present invention, there is provided a method of adaptively setting a reference sensing boundary of a touch sensor, the method including adaptively setting a reference sensing boundary of a capacitance by using a signal generated by a reference touch sensor, determining whether or not a value measured by a device control touch sensor controlling a device to which the reference touch sensor is attached is within the set reference sensing boundary, and outputting the measured value if the determination result indicates that the measured value is within the reference sensing boundary.

According to another aspect of the present invention, there is provided an apparatus for determining whether a measured value is within a reference sensing boundary, the apparatus including: a reference sensing boundary setting unit to set the reference sensing boundary of a capacitance by using a signal generated by a reference touch sensor; a determination unit to determine whether or not the measured value measured by a device control touch sensor is within the set reference sensing boundary, by sensing a change in the capacitance; and an output unit to output the measured value if the determination result indicates that the measured value is within the reference sensing boundary.

According to another aspect of the present invention, there is provided a method of determining whether a measured value is within a reference sensing boundary, the method including: setting the reference sensing boundary of a capacitance by using a signal generated by a reference touch sensor; determining whether or not a value measured by a device control touch sensor is within the set reference sensing boundary; and outputting the measured value if the determination result indicates that the measured value is within the reference sensing boundary.

According to another aspect of the present invention, there is provided an apparatus for determining whether a measured value is within a reference sensing boundary, the apparatus including: a determination unit to determine whether or not the measured value measured by a device control touch sensor is within the set reference sensing boundary, by sensing a change in the capacitance; and an output unit to output the measured value if the determination result indicates that the measured value is within the reference sensing boundary.

According to another aspect of the present invention, there is provided a method of determining whether a measured value is within a reference sensing boundary, the method including: determining whether or not a value measured by a device control touch sensor is within a set reference sensing boundary; and outputting the measured value if the determination result indicates that the measured value is within the reference sensing boundary.

According to another aspect of the present invention, there is provided at least one computer readable medium storing computer readable instructions that control at least one processor to implement the methods of the present invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The above and/or other aspects, features, and advantages of the invention will become apparent and more readily appreciated from the following description of exemplary embodiments, taken in conjunction with the accompanying drawings of which.

DETAILED DESCRIPTION OF THE PREFERRED EMBODIMENTS

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Figure 1:
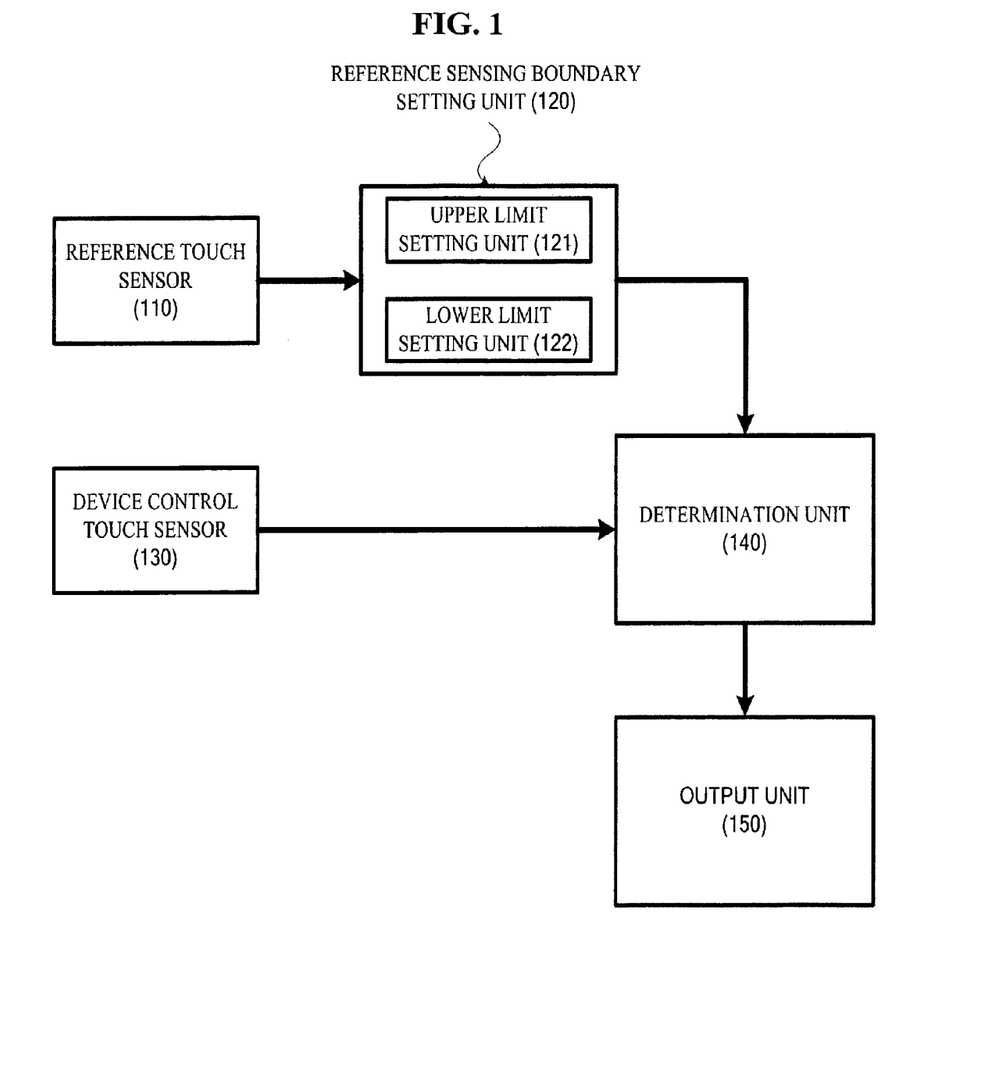
FIG. 1 is a block diagram illustrating an entire structure of an apparatus for adaptively setting a reference sensing boundary of a touch sensor according to an exemplary embodiment of the present invention.

FIG. 1 is a block diagram illustrating an entire structure of an apparatus for adaptively setting a reference sensing boundary of a touch sensor according to an exemplary embodiment of the present invention. Referring to FIG. 1, the apparatus for adaptively setting a reference sensing boundary of a touch sensor is composed of a reference touch sensor 110, a reference sensing boundary setting unit (reference sensing boundary setter) 120, a device control touch sensor 130, a determination unit (determiner) 140 and an output unit 150. The reference sensing boundary setting unit (reference sensing boundary setter) 120 includes an upper limit setting unit (upper limit setter) 121, and a lower limit setting unit (lower limit setter) 122.

Figure 2:
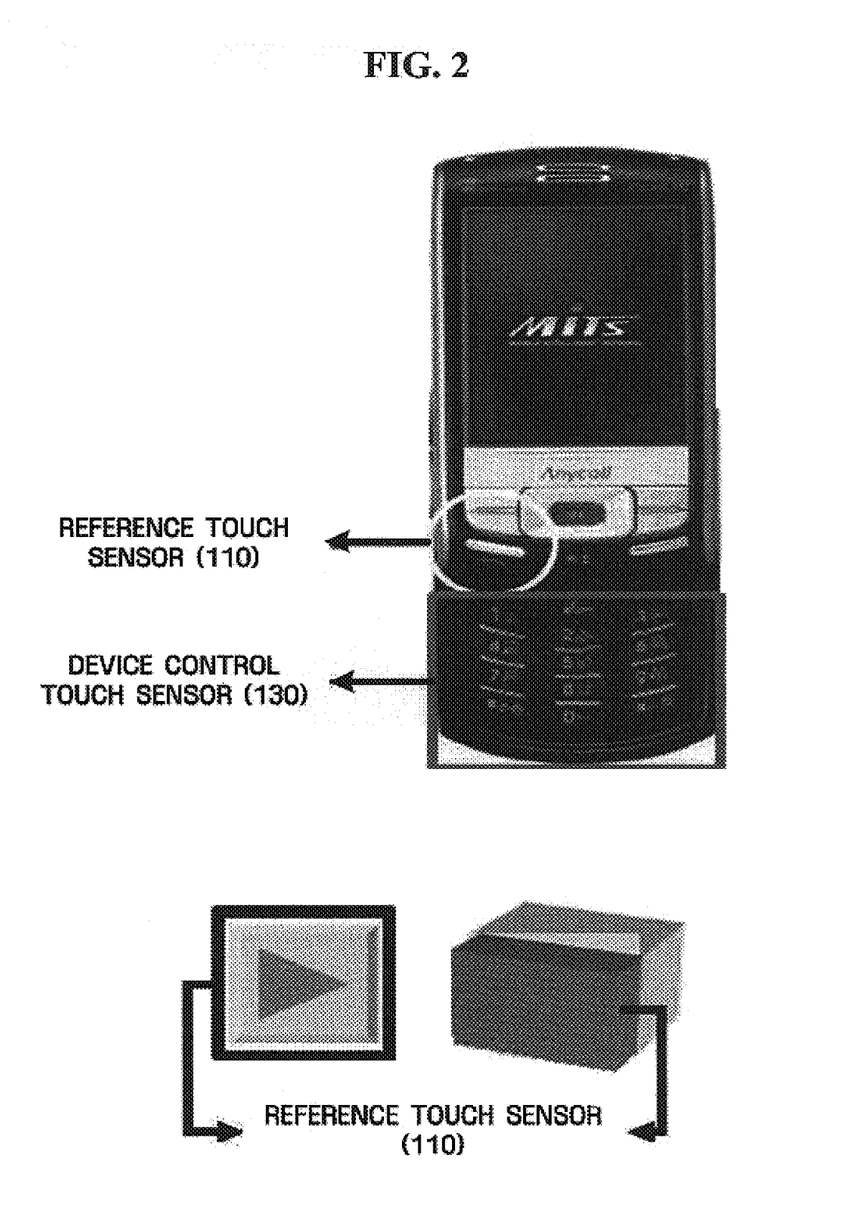
FIG. 2 illustrates a reference touch sensor and a device control touch sensor attached to a device according to an exemplary embodiment of the present invention.

The reference touch sensor 110 senses a change in capacitance and the reference sensing boundary setting unit 120 sets a reference sensing boundary so that a signal sensed by the device control touch sensor 130, which is an ordinary touch sensor controlling a device, can be output. The reference touch sensor 110 may be attached in the vicinity of or on the underside of a button that a user frequently uses among input buttons disposed on the device, so that the reference touch sensor 110 can be always adapted to reflect surrounding moisture or environmental effects. This is illustrated in FIG. 2. FIG. 2 illustrates a reference touch sensor 110 and a device control touch sensor 130 attached to a device according to an exemplary embodiment of the present invention.

Referring to FIG. 2, a mobile phone is shown as an example of a device to which an apparatus according to an exemplary embodiment of the present invention is applied. Examples of other devices to which an apparatus of an exemplary embodiment may be applied include a personal digital assistant, MP3 player, digital camera, portable media player, and portable game player. Further, it is understood that the present invention is also applicable to any device with which an apparatus of an exemplary embodiment can be used. However, a mobile phone is shown and used as an example of a device to which an apparatus according to an exemplary embodiment of the present invention can be applied.

An apparatus of an exemplary embodiment can be made to be attached in the vicinity of or inside of an input button (coupled to or part of an input button) that the user uses equal to or more than a predetermined threshold number of times among input buttons of a mobile phone. Examples of the input button that the user uses equal to or more than the predetermined threshold number of times in the mobile phone may include a 'call button' or a 'confirm button', and in FIG. 2, the apparatus is attached to the bottom side of the 'call button'. It can also be seen that the device control touch sensor 130 is attached to number buttons of the mobile phone.

The reference sensing boundary setting unit 120 adaptively sets a reference sensing boundary of a capacitance by using a signal generated by the reference touch sensor 110. In the conventional technology, a reference value of a capacitance is set and a signal is output only when the signal is equal to or greater than the reference value. However, in the present exemplary embodiment of the present invention, a reference value is not set. Instead, in an exemplary embodiment of the present invention, a reference sensing boundary having both an upper limit and a lower limit is set such that when a signal is measured and found to be between (within) the upper limit and the lower limit, the signal is output. Accordingly, a structure to set the upper limit and lower limit and to update the limits is required, and this is performed by the upper limit setting unit 121 and the lower limit setting unit 122.

When the input button (to which the reference touch sensor 110 is attached) is pressed, the upper limit setting unit 121 sets an upper limit of the reference sensing boundary by using a signal ($r_p$) generated by the reference touch sensor 110. Also, whenever the input button is pressed, the upper limit of the reference sensing boundary is newly updated so that the upper limit setting unit 121 is operable to reflect changes in the surrounding environment.

When the input button is released by a user's finger, that is, when the input button is left in an unpressed state, the lower limit setting unit 122 sets a lower limit of the reference sensing boundary using a signal ($r_r$) generated by the reference touch sensor 110. Also, whenever the user's finger leaves the input button and the input button is released, the lower limit of the reference sensing boundary is newly updated so that the lower limit setting unit 122 is operable to reflect changes in the surrounding environment.

Here, since the upper limit and the lower limit, each of which may be understood as mean values, are preferably set as values modified smoothly, a maximum mean value and a minimum mean value need to be set by filtering the signal values ($r_p$ and $r_r$) generated when the input button is pressed or released with a filter. Filters that can be used here may be a moving average filter or a low pass filter.

Figure 3:
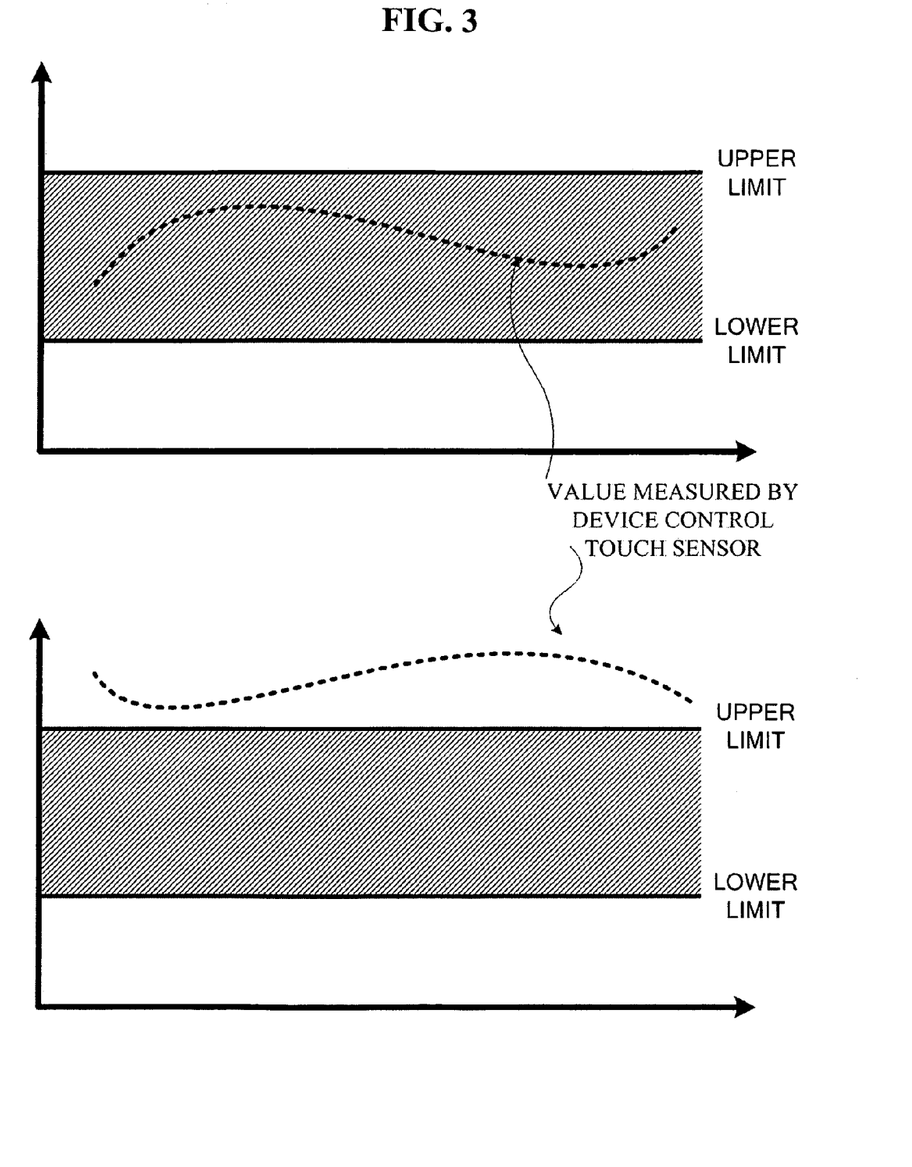
FIG. 3 illustrates an upper limit and a lower limit of a reference sensing boundary of a touch sensor according to an exemplary embodiment of the present invention.

A reference sensing boundary obtained using the filter is shown in FIG. 3. FIG. 3 illustrates an upper limit and a lower limit of a reference sensing boundary of a touch sensor according to an exemplary embodiment of the present invention. Referring to FIG. 3, the graph at the top corresponds to a case where a value measured by the device control touch sensor 130 is within the reference sensing boundary, and the graph at the bottom corresponds to a case where a value measured is not within the reference sensing boundary.

The upper limit is a maximum mean value calculated using the moving average filter or the low pass filter, and a maximum mean value $r_{max}(k)$ using samples acquired until a k-th sample is reached at a predetermined time can be obtained by equation 1 below:

$$r_{max}(k) = r_{max}(k-1) + \frac{1}{n}[r_p(k) - r_p(k-n)] \quad (1)$$

where $r_{max}(k-1)$ is a maximum mean value at (k-1), n is the number of times that the maximum mean values are measured at a previous time, $r_p(k)$ is a signal generated when the input button is pressed at k, and $r_p(k-n)$ is a signal generated when the input button is pressed at (k-n).

Also, the lower limit is a minimum mean value calculated using the moving average filter or the low pass filter, and a minimum mean value $r_{min}(k)$ using samples acquired until a to k-th sample is reached at a predetermined time can be obtained by equation 2 below:

$$r_{min}(k) = r_{min}(k-1) + \frac{1}{n}[r_r(k) - r_r(k-n)] \quad (2)$$

where $r_{min}(k-1)$ is a minimum mean value at (k-1), n is the number of times that the minimum man values are measured in the previous times, $r_r(k)$ is a signal generated when the input button is released at k, and $r_p(k-n)$ is a signal generated when the input button is released at (k-n).

Meanwhile, the device control touch sensor 130 is a sensor for controlling functions of a device to which the reference touch sensor 110 is attached, by sensing a change in a capacitance. The device control touch sensor 130 may be implemented as a touch pad, and the determination unit 140 determines whether or not a value measured by this device control touch sensor 130 is within the set reference sensing boundary.

Then, according to the determination result, the output unit 150 outputs the measured value. As illustrated in FIG. 3, if the measured value is within the set reference sensing boundary (the top graph of FIG. 3), the output unit 150 outputs the measured value and if the measured value is not within the set reference sensing boundary (the bottom graph of FIG. 3), the output unit 150 does not output the measured value.

Meanwhile, the term 'unit', as used in FIG. 1, denotes, but is not limited to, a software or hardware component, such as a Field Programmable Gate Array (FPGA) or Application Specific Integrated Circuit (ASIC), which performs certain tasks. A unit may advantageously be configured to reside on the addressable storage medium and configured to execute on one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and units. In addition, the components and units may be implemented such that they execute one or more central processing units (CPUs) in a device or system, such as a communication device (e.g. mobile phone) or communication system.

The sequence of operations of the present exemplary embodiment of the present invention will now be explained with reference to FIGS. 4 and 5.

Figure 4:
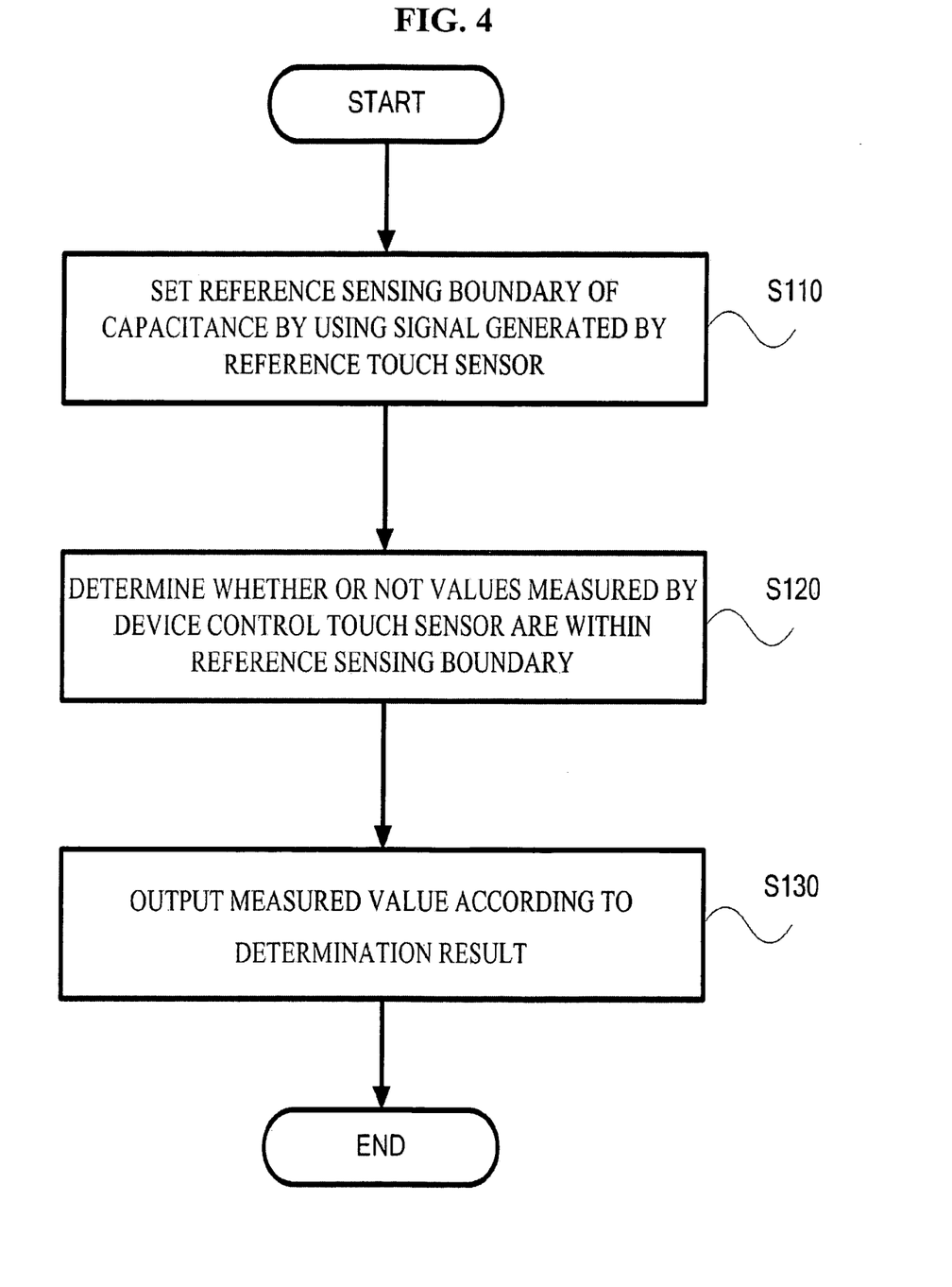
FIG. 4 is a flowchart illustrating a method of adaptively setting a reference sensing boundary of a touch sensor according to an exemplary embodiment of the present invention.
Figure 5:
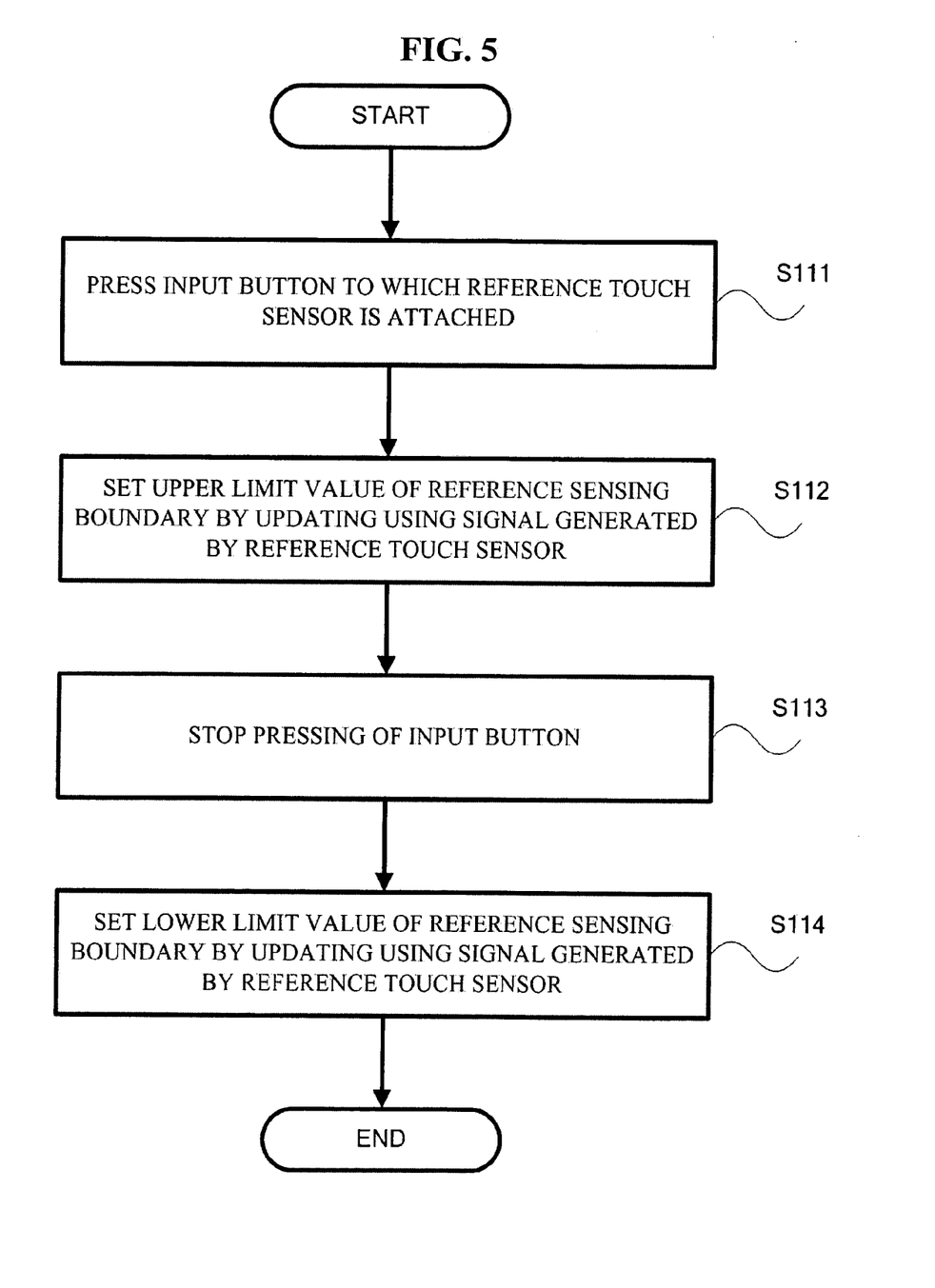
FIG. 5 illustrates a process of setting an upper limit and a lower limit of a reference sensing boundary of a touch sensor through updating, according to an exemplary embodiment of the present invention.

FIG. 4 is a flowchart illustrating a method of adaptively setting a reference sensing boundary of a touch sensor according to an exemplary embodiment of the present invention, and FIG. 5 illustrates a process of setting an upper limit and a lower limit of a reference sensing boundary of a touch sensor through updating, according to an exemplary embodiment of the present invention.

First, by using a signal generated by the reference touch sensor 110, the reference sensing boundary setting unit 120 adaptively sets a reference sensing boundary of a capacitance in operation S110. A process of adaptively setting and updating the reference sensing boundary will now be explained with reference to FIG. 5.

If the user presses an input button to which the reference touch sensor 110 is attached in operation S11, a signal is generated by the reference touch sensor 110, and by using the generated signal, the upper limit of the reference sensing boundary is updated and set in operation S112. Meanwhile, the reference touch sensor 110 may be attached in the vicinity of or inside an input button that the user uses equal to or more than a predetermined number of times among input buttons disposed on the device.

Then, if the user releases the input button, and leaves the input button in an unpressed state in operation S113, by using a signal generated by the reference touch sensor 110, the lower limit of the reference sensing boundary is updated and set in operation S114. Since the upper limit value and the lower limit value calculated by using the moving average filter or low pass filter are explained above with reference to equations 1 and 2, a detailed explanation will be omitted here.

Meanwhile, the determination unit 140 determines whether or not a value measured by the device control touch sensor 130 controlling the functions of the device to which the reference touch sensor 110 is attached is within the set reference sensing boundary in operation S120.

Then, the output unit 150 outputs the measured value according to the determination result in operation S130. That is, if the measured value is within the set reference sensing boundary, the output unit 150 outputs the measured value, and if the measured value is not within the set reference sensing boundary, the output unit 150 does not output the measured value.

Meanwhile, it can be clearly understood by a person skilled in the art of the present invention that the apparatus for and method of adaptively setting a reference sensing boundary of a touch sensor according to exemplary embodiments of the present invention may be realized as a computer readable recording medium having embodied thereon a computer program executing the method in a computer.

According to an exemplary embodiment of the present invention, a reference sensing boundary of the touch sensor is automatically recalculated without a user's intervention and a sensitivity and threshold of the touch sensor are adaptively changed so that the operational reliability of the touch sensor can be enhanced.

In addition to the above-described exemplary embodiments, exemplary embodiments of the present invention can also be implemented by executing computer readable code/instructions in/on a medium/media, e.g., a computer readable medium/media. The medium/media can correspond to any medium/media permitting the storing and/or transmission of the computer readable code/instructions. The medium/media may also include, alone or in combination with the computer readable code/instructions, data files, data structures, and the like. Examples of code/instructions include both machine code, such as produced by a compiler, and files containing higher level code that may be executed by a computing device and the like using an interpreter.

The computer readable code/instructions can be recorded/transferred in/on a medium/media in a variety of ways, with examples of the medium/media including magnetic storage media (e.g., floppy disks, hard disks, magnetic tapes, etc.), optical media (e.g., CD-ROMs, DVDs, etc.), magneto-optical media (e.g., floptical disks), hardware storage devices (e.g., read only memory media, random access memory media, flash memories, etc.) and storage/transmission media such as carrier waves transmitting signals, which may include computer readable code/instructions, data files, data structures, etc. Examples of storage/transmission media may include wired and/or wireless transmission media. For example, storage/transmission media may include optical wires/lines, waveguides, and metallic wires/lines, etc. including a carrier wave transmitting signals specifying instructions, data structures, data files, etc. The medium/media may also be a distributed network, so that the computer readable code/instructions are stored/transferred and executed in a distributed fashion. The medium/media may also be the Internet. The computer readable code/instructions may be executed by one or more processors. The computer readable code/instructions may also be executed and/or embodied in at least one application specific integrated circuit (ASIC) or Field Programmable Gate Array (FPGA).

In addition, hardware devices may be configured to act as one or more software modules in order to perform the operations of the above-described exemplary embodiments.

The term "module," as used herein, denotes, but is not limited to, a software or hardware component, which performs certain tasks. A module may advantageously be configured to reside on the addressable storage medium/media and configured to execute on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules. In addition, the components and the modules can operate at least one processor (e.g. central processing unit (CPU)) provided in a device.

The computer readable code/instructions and computer readable medium/media may be those specially designed and constructed for the purposes of the present invention, or they may be of the kind well-known and available to those skilled in the art of computer hardware and/or computer software.

Although a few exemplary embodiments of the present invention have been shown and described, it would be appreciated by those skilled in the art that changes may be made in these exemplary embodiments without departing from the principles and spirit of the invention, the scope of which is defined in the claims and their equivalents.

What is claimed is:

1. An apparatus for determining whether a measured value is within a reference sensing boundary, the apparatus comprising:
   a reference sensing boundary setting unit to set the reference sensing boundary of a capacitance by using a signal generated by a reference touch sensor, wherein the reference sensing boundary has an upper limit and a lower limit;
   a determination unit to determine whether or not the measured value measured by a device control touch sensor is within the set reference sensing boundary, by sensing a change in the capacitance; and
   an output unit to output the measured value if the determination result indicates that the measured value is within the reference sensing boundary,
   wherein the upper limit is a maximum mean value calculated using a moving average filter and the lower limit is a minimum mean value calculated using the moving average filter.

2. The apparatus of claim 1, wherein the reference touch sensor is coupled to an input button that a user uses equal to or more than a predetermined threshold number of times among input buttons disposed on the apparatus.

3. The apparatus of claim 2, wherein the reference sensing boundary setting unit comprises:
   an upper limit setting unit setting the upper limit of the reference sensing boundary using a signal generated by the reference touch sensor when the input button is pressed; and
   a lower limit setting unit setting the lower limit of the reference sensing boundary using a signal generated by the reference touch sensor when the input button is released.

4. The apparatus of claim 3, wherein the maximum mean value $r_{max}(k)$ using samples measured until a k-th sample is reached at a predetermined time can be obtained by the following equation:

$$r_{max}(k) = r_{max}(k-1) + \frac{1}{n}[r_p(k) - r_p(k-n)]$$

where $r_{max}(k-1)$ is a maximum mean value at $(k-1)$, n is the number of times that the maximum mean values are measured at a previous time, $r_p(k)$ is a signal generated when the input button is pressed at k, and $r_p(k-n)$ is a signal generated when the input button is pressed at $(k-n)$.

5. The apparatus of claim 3, wherein the minimum mean value $r_{min}(k)$ using samples acquired until a k-th sample is reached at a predetermined time can be obtained by the following equation:

$$r_{min}(k) = r_{min}(k-1) + \frac{1}{n}[r_r(k) - r_r(k-n)]$$

where $r_{min}(k-1)$ is a minimum mean value at (k−1), n is the number of times that the minimum mean values are measured at the previous time, $r_r(k)$ is a signal generated when the input button is released at k, and $r_p(k-n)$ is a signal generated when the input button is released at (k−n).

6. The apparatus of claim 2, wherein the reference sensing boundary setting unit updates and sets the reference sensing boundary whenever the input button is pressed and released.

7. The apparatus of claim 2, wherein the input button that the user uses equal to or more than a predetermined threshold number of times is a call button or a confirm button in the case of mobile terminal.

8. The apparatus of claim 1, wherein the measured value is not output if the determination result indicates that the measured value is not within the reference sensing boundary.

9. The apparatus of claim 1, wherein the reference touch sensor is part of an input button that a user uses equal to or more than a predetermined threshold number of times among input buttons disposed on the apparatus.

10. The apparatus of claim 9, wherein the reference sensing boundary setting unit comprises:
an upper limit setting unit setting the upper limit of the reference sensing boundary using a signal generated by the reference touch sensor when the input button is pressed; and
a lower limit setting unit setting the lower limit of the reference sensing boundary using a signal generated by the reference touch sensor when the input button is released.

11. The apparatus of claim 10, wherein the upper limit is a maximum mean value calculated using a moving average filter, and a maximum mean value $r_{max}(k)$ using samples measured until a k-th sample is reached at a predetermined time can be obtained by the following equation:

$$r_{max}(k) = r_{max}(k-1) + \frac{1}{n}[r_p(k) - r_p(k-n)]$$

where $r_{max}(k-1)$ is a maximum mean value at (k−1), n is the number of times that the maximum mean values are measured at a previous time, $r_p(k)$ is a signal generated when the input button is pressed at k, and $r_p(k-n)$ is a signal generated when the input button is pressed at (k−n).

12. The apparatus of claim 10, wherein the lower limit is a minimum mean value calculated using a moving average filter, and a minimum mean value $r_{min}(k)$ using samples acquired until a k-th sample is reached at a predetermined time can be obtained by the following equation:

$$r_{min}(k) = r_{min}(k-1) + \frac{1}{n}[r_r(k) - r_r(k-n)]$$

where $r_{min}(k-1)$ is a minimum mean value at (k−1), n is the number of times that the minimum mean values are measured at the previous time, $r_r(k)$ is a signal generated when the input button is released at k, and $r_p(k-n)$ is a signal generated when the input button is released at (k−n).

13. The apparatus of claim 9, wherein the reference sensing boundary setting unit updates and sets the reference sensing boundary whenever the input button is pressed and released.

14. The apparatus of claim 9, wherein the input button that the user uses equal to or more than a predetermined threshold number of times is a call button or a confirm button in the case of mobile terminal.

15. A method of determining whether a measured value is within a reference sensing boundary, the method comprising:
setting the reference sensing boundary of a capacitance by using a signal generated by a reference touch sensor, wherein the reference sensing boundary has an upper limit and a lower limit;
determining whether or not a value measured by a device control touch sensor is within the set reference sensing boundary; and
outputting the measured value if the determination result indicates that the measured value is within the reference sensing boundary,
wherein the upper limit is a maximum mean value calculated using a moving average filter and the lower limit is a minimum mean value calculated using the moving average filter.

16. The method of claim 15, wherein the reference touch sensor is coupled to an input button that a user uses equal to or more than a predetermined threshold number of times.

17. The method of claim 16, wherein the setting of the reference sensing boundary comprises:
setting the upper limit of the reference sensing boundary using a signal generated by the reference touch sensor when the input button is pressed; and
setting the lower limit of the reference sensing boundary using a signal generated by the reference touch sensor when the input button is released.

18. The method of claim 17, wherein the maximum mean value $r_{max}(k)$ using samples measured until a k-th sample is reached at a predetermined time can be obtained by the following equation:

$$r_{max}(k) = r_{max}(k-1) + \frac{1}{n}[r_p(k) - r_p(k-n)]$$

where $r_{max}(k-1)$ is a maximum mean value at (k−1), n is the number of times that the maximum mean values are measured at a previous time, $r_p(k)$ is a signal generated when the input button is pressed at k, and $r_p(k-n)$ is a signal generated when the input button is pressed at (k−n).

19. The method of claim 17, wherein the minimum mean value $r_{min}(k)$ using samples acquired until a k-th sample is reached at a predetermined time can be obtained by the following equation:

$$r_{min}(k) = r_{min}(k-1) + \frac{1}{n}[r_r(k) - r_r(k-n)]$$

where $r_{min}(k-1)$ is a minimum mean value at (k−1), n is the number of times that the minimum mean values are measured at the previous time, $r_r(k)$ is a signal generated when the input button is released at k, and $r_p(k-n)$ is a signal generated when the input button is released at (k−n).

20. The method of claim 15, the setting of the reference sensing boundary comprises:
updating and setting the reference sensing boundary whenever the input button is pressed and released.

21. The method of claim 15, wherein the input button that the user uses equal to or more than a predetermined threshold number of times is a call button or a confirm button in the case of mobile terminal.

22. At least one computer readable medium storing computer readable instructions that control at least one processor to implement the method of claim 15.

23. The method of claim 15, wherein the reference touch sensor is part of an input button that a user uses equal to or more than a predetermined threshold number of times.

24. The method of claim 23, wherein the setting of the reference sensing boundary comprises:
setting the upper limit of the reference sensing boundary using a signal generated by the reference touch sensor when the input button is pressed; and
setting the lower limit of the reference sensing boundary using a signal generated by the reference touch sensor when the input button is released.

25. The method of claim 24, wherein the upper limit is a maximum mean value calculated using a moving average filter, and a maximum mean value $r_{max}(k)$ using samples measured until a k-th sample is reached at a predetermined time can be obtained by the following equation:

$$r_{max}(k) = r_{max}(k-1) + \frac{1}{n}[r_p(k) - r_p(k-n)]$$

where $r_{max}(k-1)$ is a maximum mean value at (k−1), n is the number of times that the maximum mean values are measured at a previous time, $r_p(k)$ is a signal generated when the input button is pressed at k, and $r_p(k-n)$ is a signal generated when the input button is pressed at (k−n).

26. The method of claim 24, wherein the lower limit is a minimum mean value calculated using a moving average filter, and a minimum mean value $r_{min}(k)$ using samples acquired until a k-th sample is reached at a predetermined time can be obtained by the following equation:

$$r_{min}(k) = r_{min}(k-1) + \frac{1}{n}[r_r(k) - r_r(k-n)]$$

where $r_{min}(k-1)$ is a minimum mean value at (k−1), n is the number of times that the minimum mean values are measured at the previous time, $r_r(k)$ is a signal generated when the input button is released at k, and $r_p(k-n)$ is a signal generated when the input button is released at (k−n).

27. The method of claim 23, the setting of the reference sensing boundary comprises:
updating and setting the reference sensing boundary whenever the input button is pressed and released.

28. The method of claim 23, wherein the input button that the user uses equal to or more than a predetermined threshold number of times is a call button or a confirm button in the case of mobile terminal.

29. An apparatus for determining whether a measured value is within a reference sensing boundary, the apparatus comprising:
a determination unit to determine whether or not the measured value measured by a device control touch sensor is within the set reference sensing boundary, by sensing a change in the capacitance, wherein the reference sensing boundary has an upper limit and a lower limit; and
an output unit to output the measured value if the determination result indicates that the measured value is within the reference sensing boundary,
wherein the upper limit is a maximum mean value calculated using a moving average filter and the lower limit is a minimum mean value calculated using the moving average filter.

30. A method of determining whether a measured value is within a reference sensing boundary, the method comprising:
determining whether or not a value measured by a device control touch sensor is within a set reference sensing boundary, wherein the reference sensing boundary has an upper limit and a lower limit; and
outputting the measured value if the determination result indicates that the measured value is within the reference sensing boundary,
wherein the upper limit is a maximum mean value calculated using a moving average filter and the lower limit is a minimum mean value calculated using the moving average filter.

31. At least one computer readable medium storing computer readable instructions that control at least one processor to implement the method of claim 30.

* * * * *